(12) United States Patent
Baek et al.

(10) Patent No.: US 8,097,940 B2
(45) Date of Patent: Jan. 17, 2012

(54) STACK PACKAGE

(75) Inventors: Seung-Duk Baek, Hwaseong-si (KR); Sun-Won Kang, Seoul (KR); Jong-Joo Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 120 days.

(21) Appl. No.: 12/588,382

(22) Filed: Oct. 14, 2009

(65) Prior Publication Data

US 2010/0090326 A1 Apr. 15, 2010

(30) Foreign Application Priority Data

Oct. 14, 2008 (KR) ........................ 10-2008-0100607

(51) Int. Cl.
*H01L 23/02* (2006.01)
(52) U.S. Cl. . 257/686; 257/698; 257/777; 257/E25.006; 257/E25.013
(58) Field of Classification Search .................. 257/686, 257/698, 699, 777, E23.011, E25.006, E25.013
See application file for complete search history.

(56) References Cited

U.S. PATENT DOCUMENTS 7,211,883 B2 * 5/2007 Oka et al. ...................... 257/678
7,786,568 B2 * 8/2010 Chen ............................. 257/698

FOREIGN PATENT DOCUMENTS

KR 10-0699807 3/2007
KR 10-0784498 12/2007

* cited by examiner

*Primary Examiner* — Hoai V Pham
(74) *Attorney, Agent, or Firm* — Harness, Dickey & Pierce, P.L.C.

(57) ABSTRACT

A stack package may include a substrate having first and second faces opposite each other and an opening formed therein. The first semiconductor chip may be mounted on the first face of the substrate and include a through electrode in the middle region of the first semiconductor chip that is exposed through the opening. The second semiconductor chip may be stacked on the first semiconductor chip and electrically connected to the first semiconductor chip by the through electrode of the first semiconductor chip. The circuit pattern may be formed on the second face of the substrate and include a bonding pad arranged adjacent to the opening and electrically connected to the through electrode of the first semiconductor chip through the opening, an outer connection pad spaced apart from the bonding pad and a connection wiring extending from the opening to the outer connection pad via the bonding pad.

15 Claims, 5 Drawing Sheets

STACK PACKAGE

CROSS-REFERENCE TO RELATED PATENT APPLICATION

This application claims priority under 35 U.S.C. §119 to Korean Patent Application No. 10-2008-0100607, filed on Oct. 14, 2008, in the Korean Intellectual Property Office (KIPO), the entire contents of which are incorporated by reference.

BACKGROUND

1. Field

Example embodiments relate to a stack package and a method of manufacturing the stack package. More particularly, example embodiments relate to a stack package including a plurality of stacked semiconductor chips and a method of manufacturing the stack package.

2. Description of the Related Art

Semiconductor packages are becoming miniaturized and lightweight according to the miniaturization trend of electronic products using semiconductor devices. For example, memory devices, e.g., dynamic random access memory (DRAM) or flash memory, may be mounted in a chip scale package of the semiconductor package. The chip scale package may be broadly applicable to miniaturized and mobile products.

On the other hand, in order to ensure reliability and price competitiveness of the chip scale package, a stack package including stacked semiconductor chips on a wafer level has been researched.

The wafer level stack package may include a mounting substrate and semiconductor chips stacked on the mounting substrate. For example, the stacked semiconductor chips may be electrically connected to one another by a through electrode that penetrates the semiconductor chip. A conductive connection member, e.g., bonding wire, may electrically connect the semiconductor chips to a bonding pad that may be connected to a circuit pattern formed on the mounting substrate.

However, in order to form the circuit pattern on the mounting substrate, an electroplating process may be performed using a relatively long plating wiring. This relatively long plating wiring may increase a capacitance and be an obstacle to high operating speed of a stack package.

SUMMARY

Example embodiments provide a stack package having a structure capable of performing high-speed operation by having a relatively short signal route. Example embodiments provide a method of manufacturing the stack package.

According to example embodiments, a stack package may include a substrate having a first face and a second face opposite the first face, and including an opening; a first semiconductor chip mounted on the first face of the substrate and including a first through electrode provided in the middle region of the first semiconductor chip, wherein the first through electrode is exposed through the opening of the substrate; a second semiconductor chip stacked on the first semiconductor chip and electrically connected to the first semiconductor chip by the first through electrode of the first semiconductor chip; and a circuit pattern on the second face of the substrate, the circuit pattern including a bonding pad arranged adjacent to the opening and electrically connected to the first through electrode of the first semiconductor chip through the opening, an outer connection pad spaced apart from the bonding pad and a connection wiring extending from the opening to the outer connection pad via the bonding pad.

In example embodiments, the first semiconductor chip may include a chip pad in the middle region, and the first through electrode may penetrate the chip pad. The first semiconductor chip may further include a redistribution pad configured to electrically connect to the chip pad. The redistribution pad may be electrically connected to the chip pad by a redistribution wiring. The stack package may further include first and second chip pads on first surfaces of the corresponding first and second semiconductor chips. The first surfaces of the first and second semiconductor chips may face the first face of the substrate or second surfaces opposite to the first surfaces of the first and second semiconductor chips may face the first face of the substrate.

In example embodiments, the bonding pad may be electrically connected to the first through electrode of the first semiconductor chip by a bonding wire. The stack package may further include a first molding member in the opening of the substrate configured to cover the first chip pads of the first semiconductor chip and the bonding wire; and a second molding member on the substrate configured to cover the first and second semiconductor chips, wherein the first and second molding members may include epoxy mold compound (EMC). The second chip pads of the second semiconductor chip may be electrically connected to the first through electrode of the first semiconductor chip via a bump.

In example embodiments, the stack package may further include a solder ball on the outer connection pad configured to connect to an external device. The first semiconductor chip may be mounted on the first face of the substrate via a first adhesive film, and the second semiconductor chip may be stacked on the first semiconductor chip via a second adhesive film. The first and second adhesive films may include at least one of epoxy and polyimide.

In example embodiments, the stack package may further include an insulation layer on the second face of the substrate, wherein the bonding pad and the outer connection pad may be exposed through the insulation layer. The connection wiring may further include a first end portion configured to extend from the bonding pad to the opening; and a second end portion opposite to the first end portion configured to extend from the bonding pad to the outer connection pad. The stack package may include a second through electrode configured to penetrate the second semiconductor chip.

According to example embodiments, a method of manufacturing a stack package may include preparing a substrate having a first face and a second face opposite the first face; forming a bonding pad and an outer connection pad on the second face of the substrate by performing an electroplating process using a plating wiring in the middle region of the substrate, wherein the bonding pad and the outer connection pad are electrically connected to the plating wiring, the bonding pad is arranged in the middle region and the outer connection pad is spaced apart from the bonding pad; forming a circuit pattern including a connection wiring extending from an opening to the outer connection pad via the bonding pad by forming the opening in the middle region of the substrate including a portion of the plating wiring; mounting a first semiconductor chip on the first face of the substrate; forming a first through electrode in the first semiconductor chip, the first through electrode being exposed through the opening of the substrate; stacking a second semiconductor chip on the first semiconductor chip, the second semiconductor chip being electrically connected to the first through electrode of the first semiconductor chip; and electrically connecting the bonding pad of the substrate to the through electrode of the first semiconductor chip through the opening of the substrate.

In example embodiments, mounting the first semiconductor chip on the first face of the substrate may further include forming a chip pad on a first surface of the first semiconductor chip; and forming the through electrode in the first semiconductor chip, the through electrode penetrating the chip pad. Mounting the first semiconductor chip on the first face of the substrate may further include forming a redistribution pad on the first surface of the first semiconductor chip. The redistribution pad may be electrically connected to the chip pad by a redistribution wiring.

In example embodiments, the method may further include forming first and second chip pads on the first surfaces of the corresponding first and second semiconductor chips. The first and second semiconductor chips may be arranged such that the first surfaces of the first and second semiconductor chips face the first face of the substrate or second surfaces opposite to the first surfaces of the first and second semiconductor chips face the first face of the substrate. The bonding pad may be electrically connected to the first through electrode of the first semiconductor chip by a bonding wire.

In example embodiments, the method may further include forming a first molding member in the opening of the substrate to cover the first chip pads of the first semiconductor chip and the bonding wire; and forming a second molding member on the substrate to cover the first and second semiconductor chips, wherein the first and second molding members include epoxy mold compound (EMC). The second chip pads of the second semiconductor chip may be electrically connected to the first through electrode of the first semiconductor chip via a bump.

In example embodiments, the method may further include forming a solder ball on the outer connection pad to connect to an external device. The first semiconductor chip may be mounted on the first face of the substrate via a first adhesive film, and the second semiconductor chip may be stacked on the first semiconductor chip via a second adhesive film. The method may further include forming an insulation layer on the second face of the substrate, wherein the bonding pad and the outer connection pad may be exposed through the insulation layer.

In example embodiments, forming the connection wiring may further include forming a first end portion to extend from the bonding pad to the opening; and forming a second end portion opposite to the first end portion to extend from the bonding pad to the outer connection pad. The method may further include forming a second through electrode to penetrate the second semiconductor chip.

According to example embodiments, first and second semiconductor chips of a stack package may be electrically connected to each other by a through electrode. The through electrode may be arranged in the middle region thereof. The first and second semiconductor chips may be electrically connected to the mounting substrate by a bonding wire through an opening of the mounting substrate.

The connection wiring may not be formed in a peripheral region of the mounting substrate. Because the connection wiring extends from the opening in the middle region to the outer connection pad, the connection wiring may have a relatively small length to decrease a capacitance loading, thus securing high operating speed of the stack package.

BRIEF DESCRIPTION OF THE DRAWINGS

Example embodiments will be more Clearly understood from the following detailed description taken in conjunction with the accompanying drawings.

FIG. 1 is a cross-sectional view illustrating a stack package in accordance with example embodiments.

FIG. 2 is a plan view illustrating a mounting substrate of the stack package in FIG. 1.

FIG. 3 is a plan view illustrating a portion of the first semiconductor chip exposed through the opening of the mounting substrate of the stack package in FIG. 1.

FIG. 4 is a plan view illustrating a portion of a first semiconductor chip exposed through the opening of the mounting substrate of a stack package in accordance with example embodiments.

FIG. 5 is a cross-sectional view illustrating a stack package in accordance with example embodiments.

FIGS. 6 to 9 are views illustrating a method of manufacturing the stack package in FIG. 1.

Figure 1:
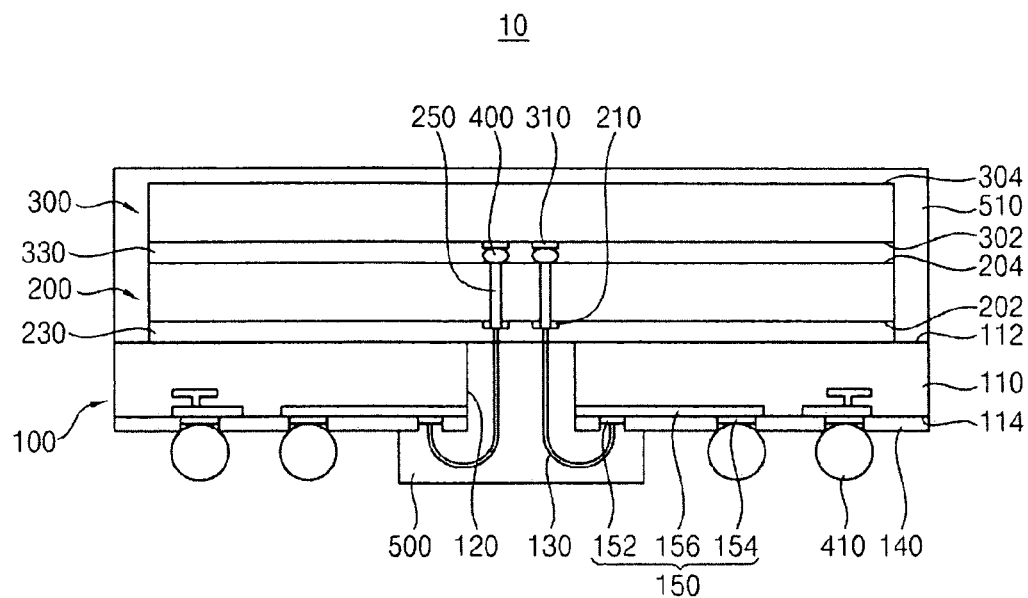
FIGS. 1 to 9 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
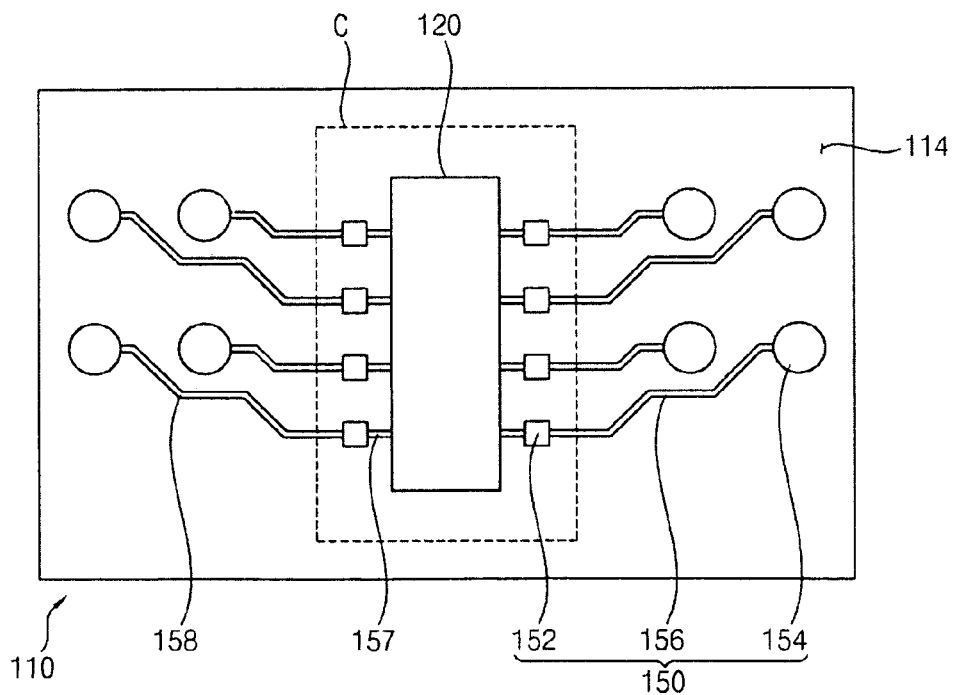

FIG. 1 is a cross-sectional view illustrating a stack package in accordance with example embodiments. FIG. 2 is a plan view illustrating a mounting substrate of the stack package in FIG. 1. Referring FIGS. 1 and 2, a stack package 10 may include a mounting substrate 100 and first and second semiconductor chips 200 and 300 stacked on the mounting substrate 100.

In example embodiments, the mounting substrate 100 may include a substrate 110 and a circuit pattern 150 formed in the substrate 110. For example, the mounting substrate 100 may be a printed circuit board (PCB). The PCB may be a multi-layered circuit board having various circuits and plugs formed therein.

The substrate 110 may have a first face 112 and a second face 114 opposite to the first face 112. The circuit pattern 150 may be formed on the second face 114 of the substrate 110. The circuit pattern 150 may include a bonding pad 152, an outer connection pad 154 and a connection wiring 156. For example, the bonding pad 152 and the outer connection pad 154 may be formed by an electroplating process. An insulation layer 140 may be formed on the second face 114 of the substrate 110, and the bonding pad 152 and the outer connection pad 154 may be exposed through the insulation layer 140.

An opening 120 may be formed in the middle region (C) of the substrate 110. A plurality of the bonding pads 152 may be formed in the middle region (C) of the substrate 110. The bonding pads 152 may be formed adjacent to the opening 120. The bonding pads 152 may be arranged along a side of the opening 120. The bonding pads may be spaced apart from one another.

The outer connection pads 154 may be formed outside the middle region (C) of the substrate 110. The outer connection pad 154 may be arranged to be spaced apart from the bonding pad 152. The area of the outer connection pad 154 may be greater than that of the bonding pad 152.

The bonding pad 152 may be electrically connected to the outer connection pad 154 by the connection wiring 156. The connection wiring 156 extends from the opening 120 to the outer connection pad 154 via the bonding pad 152.

In example embodiments, the connection wiring 156 may include a first end portion 157 and a second end portion 158 opposite to the first end portion 157. The first end portion 157 may extend from the bonding pad 152 to the opening 120. The second end portion 158 may extend from the bonding pad 152 to the outer connection pad 154.

The first semiconductor chip 200 may be mounted on the mounting substrate 100 and the second semiconductor chip 300 may be stacked on the first semiconductor chip 200. The first semiconductor chip 200 may include a first through electrode 250 that penetrates the first semiconductor chip 200. For example, the first through electrode 250 may include a metal, e.g., gold (Au), silver (Ag), copper (Cu) and/or platinum (Pt).

A plurality of first chip pads 210 may be formed on a first active surface 202 of the first semiconductor chip 200. The first through electrode 250 may be arranged in a region for the first chip pad 210 to be formed, so that the first through electrode 250 penetrates the first chip pad 210. In example embodiments, the first semiconductor chip 200 may be mounted such that the first passive surface 204 opposite the first active surface 202 of the first semiconductor chip 200 faces the first face 112 of the substrate 110. The second semiconductor chip 300 may be stacked on the first semiconductor chip 200 such that the second passive surface 304 opposite the second active surface 302 of the second semiconductor chip 300 faces the first face 112 of the substrate 110.

The first and second semiconductor chips 200 and 300 may include a plurality of circuit elements (not shown). The circuit element may include a plurality of memory devices. Examples of memory devices may be a volatile memory device and a non-volatile memory device. Examples of the volatile memory device may be DRAM and/or SRAM.

Examples of the non-volatile memory device may be EPROM, EEPROM and/or Flash EEPROM.

In example embodiments, the first and second semiconductor chips 200 and 300 may include the volatile memory device, e.g., DRAM. In example embodiments, the first chip pads 210 may be formed in the middle region of the first semiconductor chip 100, and the first chip pads 210 may be formed to be spaced apart from one another. According to example embodiments, the first and second semiconductor chips 200 and 300 may include chip pads formed in the middle region thereof. The first and second semiconductor chips 200 and 300 may be referred to as center-pad type devices.

In example embodiments, the first semiconductor chip 200 may be mounted such that the first active surface 202 faces the first face 112 of the substrate 110. For example, the first semiconductor chip 200 may be mounted on the mounting substrate 100 via a first adhesive film 230. The first chip pad 210 of the first semiconductor chip 200 and the first through electrode 250 may be exposed through the opening 120 of the substrate 100.

The second semiconductor chip 300 may be stacked on the first semiconductor chip 200. For example, the second semiconductor chip 300 may be stacked on the first semiconductor chip 200 via a second adhesive film 330. For example, the first and second adhesive films 230 and 330 may include epoxy and/or polyimide.

In example embodiments, additional semiconductor chips may be stacked on the second semiconductor chip 300, and the number of the stacked semiconductor chips should not be construed as limited thereto.

A plurality of second chip pads 310 may be formed on a second active surface 302 of the second semiconductor chip 300. In example embodiments, the second chip pads 310 may be arranged in the middle region of the second semiconductor chip 300 corresponding to the first chip pads 210. The second chip pads 310 may be formed to be spaced apart form one another.

The second semiconductor chip 300 may be stacked such that the second active surface 302 of the second semiconductor chip 300 faces the first face 112 of the substrate 110. Accordingly, the second chip pad 310 of the second semiconductor chip 300 may be arranged on the first through electrode 250 of the first semiconductor chip 200.

The second semiconductor chip 300 may be electrically connected to the first semiconductor chip 200 and the mounting substrate 100 by the first through electrode 250. The second chip pad 310 of the second semiconductor chip 300 may be electrically connected to the first through electrode 250 of the first semiconductor chip 200 via a bump 400.

In example embodiments, the first through electrode 250 of the first semiconductor chip 200 may be electrically connected to the bonding pad 152 of the mounting substrate 100 by a bonding wire 130 through the opening 120 of the substrate 110. A solder ball 410 for connection to an external device may be formed on the outer connection pad 154 that may be formed on the second face 114 of the substrate 110.

In example embodiments, the stack package 10 may include a first molding member 500. The molding member 500 may be formed in the opening 120 of the substrate 110 to cover the first chip pads of the first semiconductor chip 200 and the bonding wires 130.

The stack package 10 may include a second molding member 510. The second molding member 510 may be formed on the mounting substrate 100 to cover the first and second semiconductor chips 200 and 300. The second molding member 510 may seal the first and second semiconductor chips 200 and 300 externally to protect the first and second semiconductor chips 200 and 300 from electrical deterioration due to air or corrosion and to provide mechanical stability. For example, the first and second molding members 500 and 510 may include epoxy mold compound (EMC).

Figure 3:
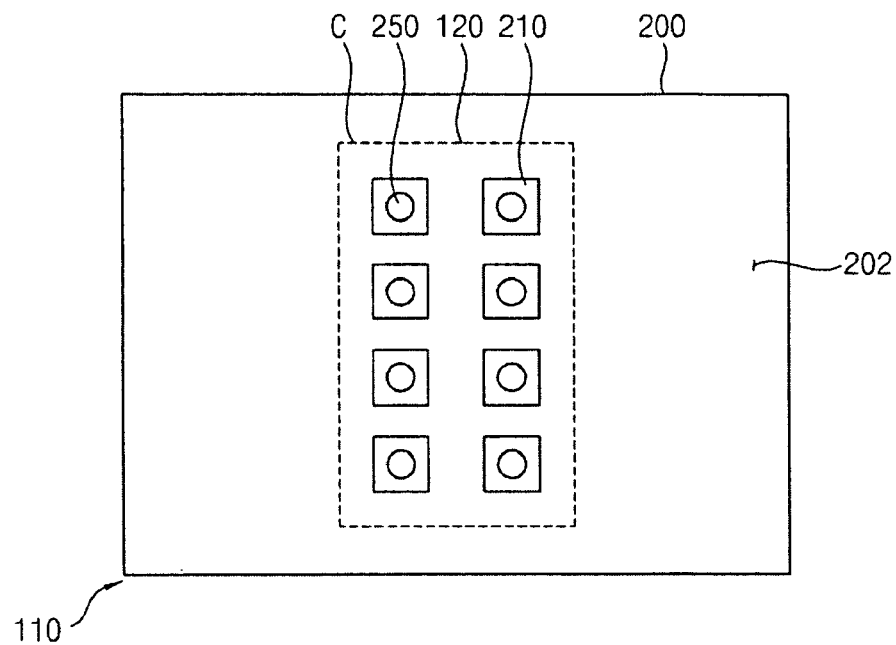
Figure 4:
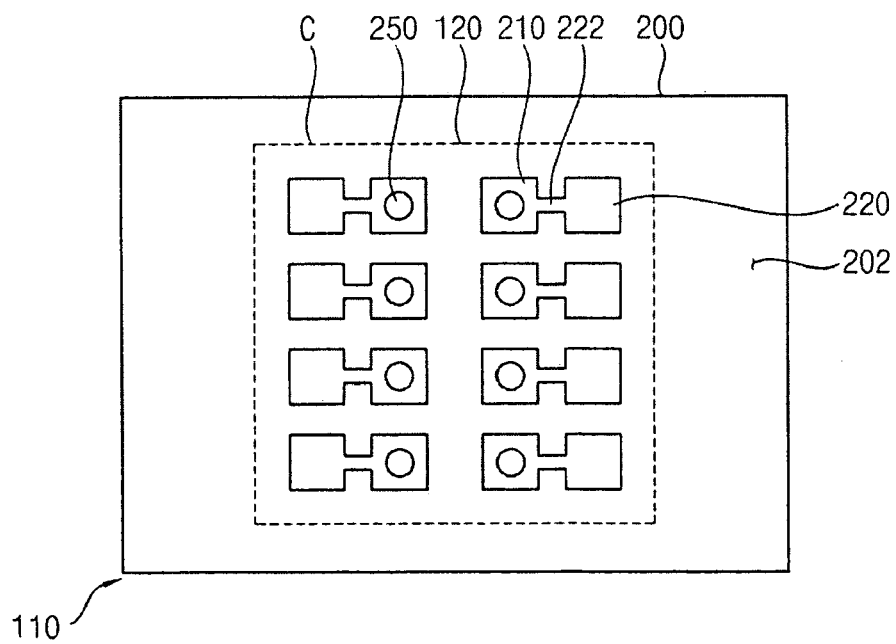

FIG. 3 is a plan view illustrating a portion of the first semiconductor chip exposed through the opening of the mounting substrate of the stack package in FIG. 1. FIG. 4 is a plan view illustrating a portion of a first semiconductor chip exposed through the opening of the mounting substrate of a stack package in accordance with example embodiments.

The first chip pads 210 may be arranged in the middle region C of the first semiconductor chip 200 and may be exposed through the opening 120 of the substrate 110. The first chip pads 210 may be formed on a first active surface 202 of the first semiconductor chip 200. Referring to FIG. 3, in example embodiments, the first through electrode 250 may be formed on a region for the first chip pad to be formed, so that the first through electrode 250 penetrates the first chip pad 210.

Referring to FIG. 4, in example embodiments, a redistribution pad 220 may be formed on the first active surface 202 of the first semiconductor chip 200. The redistribution pad 220 may be arranged adjacent to the first chip pad 210. The redistribution pad 220 may be electrically connected to the first chip pad 210 by a redistribution wiring 222.

In example embodiments, the first through electrode 250 may penetrate the first chip pad 210 and the redistribution pad 220 may be connected to an end portion of the bonding wire 130 through the opening 120 of the substrate 110. It should be understood that the position of the redistribution pad 220 may be determined based on signal types, e.g., a common input/output signal, a chip selection signal, and/or a connection structure.

In the stack package 10 according to example embodiments, a signal may be input and output through the circuit pattern 150 of the mounting substrate 100, the bonding wire 130 and the first through electrode 250. In example embodiments, the first through electrode 250 may be used as a signal transmission route having a minimized or reduced length to thereby minimize or reduce electrical loading of the stack package 10 and increase the operating speed thereof.

Further, referring to FIG. 2, the connection wiring 156 of the circuit pattern 150 formed in the substrate 110 extends from the opening 120 to the outer connection pad 154 through the bonding pad 152. For example, the circuit pattern 150 may be formed only from the middle region (C) of the substrate 110 to the outer connection pad 154. The circuit pattern 150 may not be formed in a peripheral region of the substrate 110.

Accordingly, if the circuit pattern 150: may be formed on the substrate 110 by an electroplating process, the mounting substrate 100 may include the connection wiring 156 having a relatively small length to connect the bonding pad 152 and the outer connection pad 154 to each other. Therefore, the short connection wiring 156 may decrease capacitance loading and increase the operating speed of the stack package 10.

Figure 5:
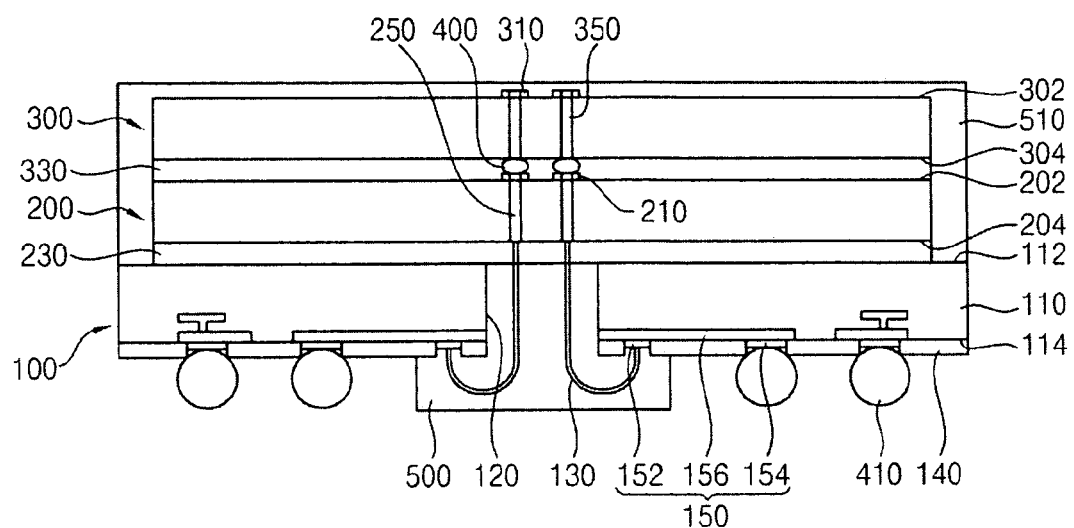

FIG. 5 is a cross-sectional view illustrating a stack package in accordance with example embodiments. A stack package as illustrated in FIG. 5 may be the same as in example embodiments of FIG. 1 except for a stacked structure of first and second semiconductor chips. Thus, the same reference numerals will be used to refer to the same or like elements as those described in example embodiments of FIG. 1, and any further explanations with respect to the same elements will be omitted.

Referring to FIG. 5, a stack package 11 according to example embodiments may include a mounting substrate 100 and first and second semiconductor chips 200 and 300 stacked on the mounting substrate 100.

The first semiconductor chip 200 may be mounted on the mounting substrate 100, and the second semiconductor chip 300 may be stacked on the first semiconductor chip 200. The first semiconductor chip 200 may be stacked on a first face 112 of a substrate 110. The first semiconductor chip 200 may include a first through electrode 250 that penetrates the first semiconductor chip 200. The second semiconductor chip 300 may include a second through electrode 350 that penetrates the second semiconductor chip 300.

A plurality of first chip pads 210 may be formed on a first active surface 202 of the first semiconductor chip 200. The first chip pads 210 may be arranged in the middle region of the first semiconductor chip 200. The first through electrode 250 may be arranged on a region for the first chip pad 210 to be formed, so that the first through electrode 240 penetrates the first chip pad 210.

A plurality of second chip pads 210 may be formed on a second active surface 302 of the second semiconductor chip 300. The second chip pads 310 may be arranged in the middle region of the second semiconductor chip 300 corresponding to the first chip pads 210 of the first semiconductor chip 200. The second through electrode 350 may be arranged on a region for the second chip pad 310 to be formed, so that the second through electrode 350 penetrates the second chip pad 310.

In example embodiments, the first semiconductor chip 200 may be mounted such that the first passive surface 204 opposite to the first active surface 202 of the first semiconductor chip 200 faces the first face 112 of the substrate 110. The second semiconductor chip 300 may be stacked on the first semiconductor chip 200 such that the second passive surface 304 opposite the second active surface 302 of the second semiconductor chip 300 faces the first face 112 of the substrate 110.

The first through electrode 250 of the first semiconductor chip 200 may be electrically connected to the second through electrode 350 of the second semiconductor chip 300 via a bump 400. Accordingly, the first semiconductor chip 200 may be electrically connected to the second semiconductor chip 300 by the first and second through electrodes 250 and 350.

In example embodiments, an end portion of the first through electrode 250 may be exposed from the first passive surface 204 opposite the first active surface 202 of the first semiconductor chip 200. The exposed end portion of the first through electrode 250 may be connected to an end portion of a bonding wire 130 through an opening 120 of the substrate 110, to be electrically connected to the mounting substrate 100.

Figure 6:
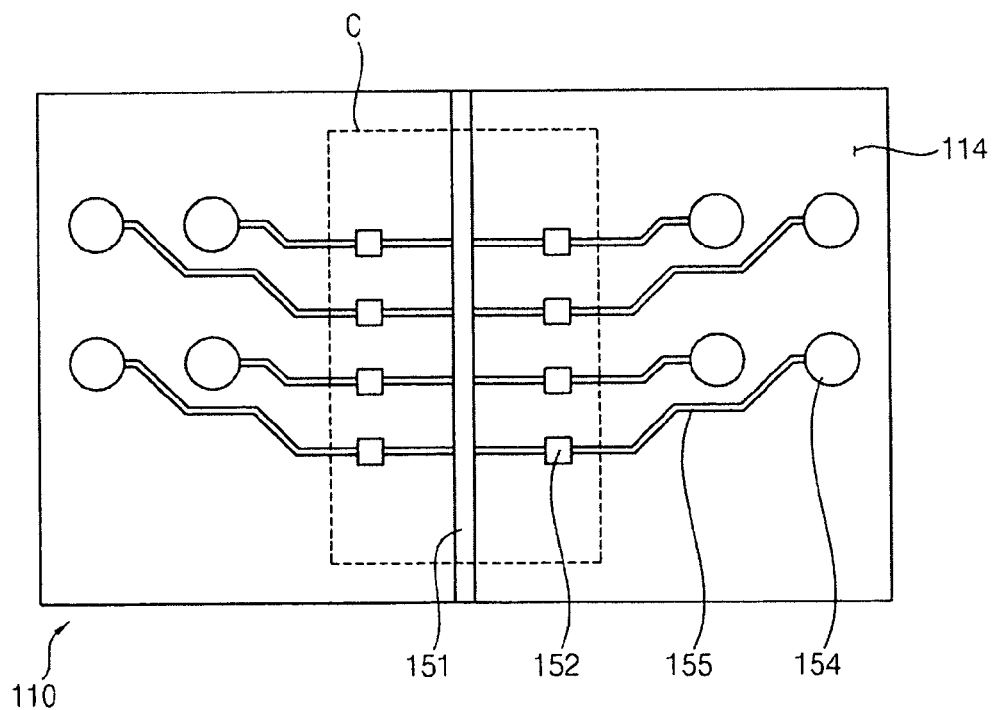

Hereinafter, a method of manufacturing the above-mentioned stack package will be described in detail. FIGS. 6 to 9 are views illustrating a method of manufacturing the stack package in FIG. 1. Referring to FIG. 6, a substrate 110 having a first face (112 in FIG. 5) and a second face 114 opposite to the first face may be prepared. The substrate 110 may be a multi-layered circuit board having various circuits and plugs formed therein. A preliminary circuit pattern (not shown) may be formed on the second face 114 of the substrate 110.

In example embodiments, a plating wiring 151 and a preliminary connection wiring 155 may be formed on the second face 114 of the substrate 110. The plating wiring 151 extends along the middle line of the second face 114 and the preliminary connection wiring 155 extends from the plating wiring 151.

An electroplating process may be performed to form a bonding pad 152 and an outer connection pad 154. The bonding pad 152 may be formed in the middle region (C) of the substrate 110. The outer connection pad 154 may be spaced apart from the bonding pad 152. In example embodiments, the plating wiring 151 may be connected to a plating electrode (not shown) for the electroplating process and the preliminary connection wiring 155 may be used to form the bonding pad 152 and the outer connection pad 154.

Figure 7:
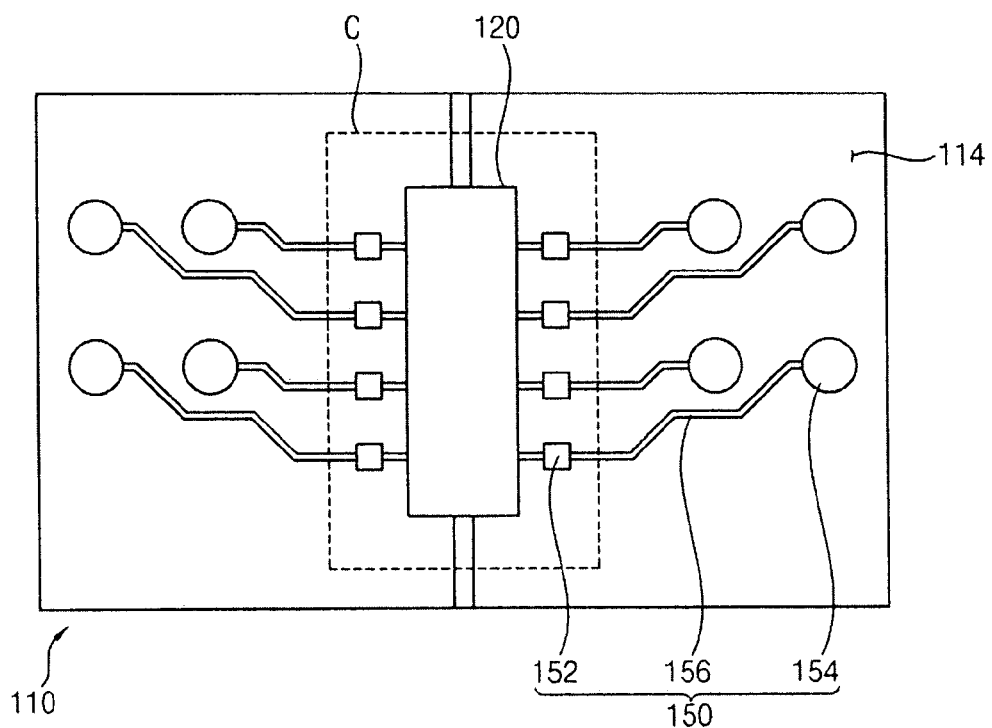

Referring to FIG. 7, an opening 120 may be formed in the middle region (C) of the substrate 110 including a portion of the plating wiring 151 so that a circuit pattern 150 may be formed on the second face 114 of the substrate 110. For example, a portion of the middle region (C) may be removed by a sawing process.

The plating wiring 151 may be partially removed to form a connection wiring 156 on the second face 114 of the substrate 110. The connection wiring 156 may extend from the opening 120 to the outer connection pad 154 via the bonding pad 152. Accordingly, after forming the opening 120, the connection wiring 156 extends from the opening 120 of the substrate 110 to the outer connection pad 154.

When the plating wiring 151 is formed in a peripheral region of the substrate 110, after the bonding pad 152 and the outer connection pad 154 are formed using the plating wiring 151, a portion of the plating wiring 151 may be removed to form the circuit pattern 150. In example embodiments, the connection wiring 156 remains in the peripheral region of the substrate 110. This connection wiring 156 having an unnecessary length may increase a capacitance loading of the stack package.

However, according to example embodiments, the plating wiring 151 may be formed in the middle region (C) of the substrate 110. Accordingly, after a portion of the plating wiring 151 may be removed, the connection wiring 156 of the circuit wiring 150 extends from the opening 120 only to the outer connection pad 154. For example, the connection wiring 156 may not remain in the peripheral region of the substrate 110. Therefore, this connection wiring 156 having a relatively small length may decrease a capacitance loading of the stack package.

Figure 8:
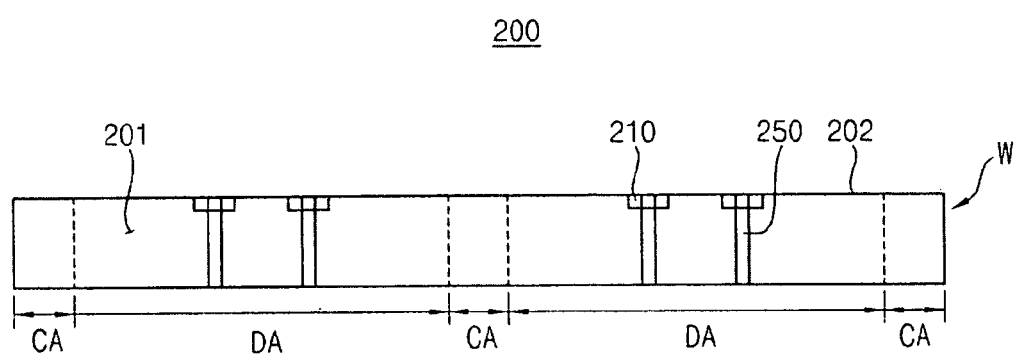

Referring to FIG. 8, a first semiconductor chip 200 having a first through electrode 250 may be formed. A wafer (W) including first preliminary semiconductor chips 201 may be prepared. In example embodiments, the wafer (W) may include a die region (DA) and a cutting region (CA). The first preliminary semiconductor chips 201 may be formed in the die region (DA). The first preliminary semiconductor chips 201 may be separated by the cutting region (CA). The cutting region (CA) may be removed by a following sawing process to form first semiconductor chips 200 respectively separated from the preliminary semiconductor chips 201.

A plurality of first chip pads 210 may be formed in the middle region of the first preliminary semiconductor chip 201. The first chip pads 210 may be formed in a first active surface 202 of the first preliminary semiconductor chip 201. The first preliminary semiconductor chips 201 may include a plurality of circuit elements formed therein. Input/output signals may be input/output to/from the circuit element through the first chip pads 210.

The first through electrodes 250 may be formed in the first preliminary semiconductor chips 201. The first through electrodes 250 may be formed in a region for the first chip pads 210 to be formed so that the first through electrode 250 penetrates the first chip pads 210. For example, the first through electrode 250 may include a metal, e.g., gold (Au), silver (Ag), copper (Cu) and/or platinum (Pt).

In example embodiments, a plurality of redistribution pads (not shown) may be formed in the first active surface 202 of the first preliminary semiconductor chip 201. The redistribution pads may be arranged adjacent to the first chip pad 210. The redistribution pads may be electrically connected to the first chip pad 210. After forming the first through electrode 250, the wafer (W) may be sawed along the cutting region (CA) to form the respectively separated first semiconductor chips 200.

Figure 9:
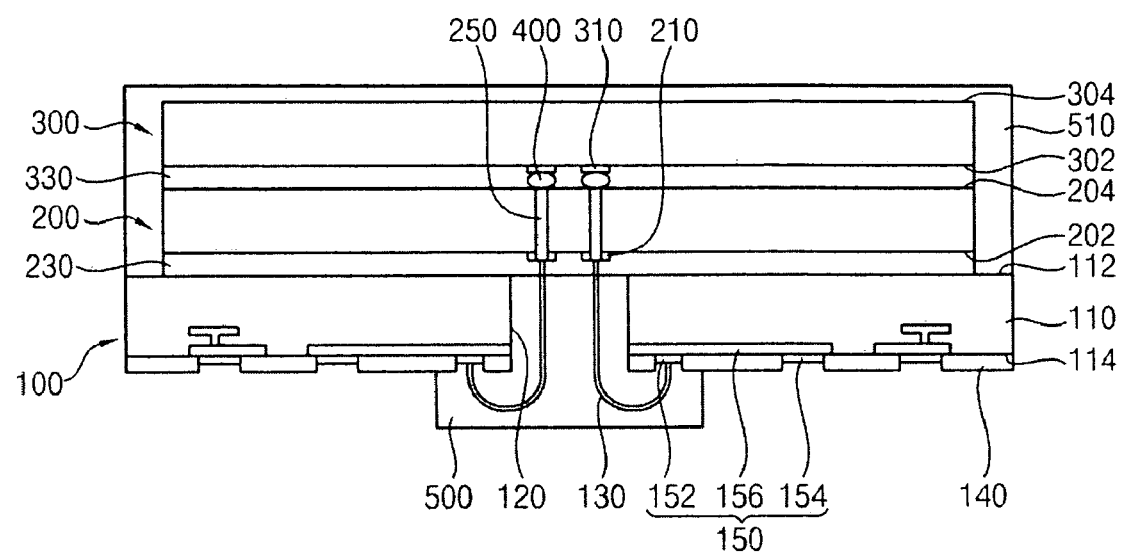

Referring to FIG. 9, the first semiconductor chip 200 may be mounted on a first face 112 of the substrate 110 and a second semiconductor chip 300 may be stacked on the first semiconductor chip 200. In example embodiments, after the second semiconductor chip 300 is stacked on the respectively separated first semiconductor chip 200, the stacked first and second semiconductor chips 200 and 300 may be mounted on the first face 112 of the substrate 110.

For example, after the second semiconductor chip 300 is stacked on the wafer (W) including the first semiconductor chip 200 formed therein (see FIG. 8), the wafer may be sawed to form the stacked first and second semiconductor chips 200 and 300. After a first semiconductor chip 200 is selected through an inspecting process of the wafer (W), the respectively separated second semiconductor chip 300 may be stacked on the selected first semiconductor chip 200. Alternatively, the respective separated second semiconductor chip 300 may be stacked on the respectively separated first semiconductor chip 200.

The first semiconductor chip 200 may be mounted on a mounting substrate 100 via a first adhesive film 230. The second semiconductor chip 300 may be stacked on the first semiconductor chip 200 via a second adhesive film 330. For example, the first and second adhesive films 230 and 330 may include epoxy and/or polyimide.

In example embodiments, additional semiconductor chips may be stacked on the second semiconductor chip 300, and the number of the stacked semiconductor chips should not be construed as limited thereto.

As illustrated in FIG. 9, in example embodiments, the first and second semiconductor chips 200 and 300 may be stacked on the mounting substrate 100 such that the first and second active surfaces 202 and 302 of the first and second semiconductor chips 200 and 300 face the first face 112 of the substrate 110.

In example embodiments, the second chip pads 310 formed on the second active surface 302 of the second semiconductor chip 300 may be electrically connected to the first through electrode 250 of the first semiconductor chip 200 by the bumps 400. Accordingly, the second semiconductor chip 300 may be electrically connected to the first semiconductor chip 200 by the first through electrode 250 of the first semiconductor chip 200.

In example embodiments, the first and second semiconductor chips 200 and 300 may be stacked on the mounting substrate 100 such that surfaces 204 and 304 opposite to the first and second active surfaces 202 and 302 of the first and second semiconductor chips 200 and 300 face the first face 112 of the substrate 110.

In example embodiments, an end portion of a second through electrode of the second semiconductor chip 300 may be electrically connected to the first through electrode 250 of the first semiconductor chip 200 by a bump 400. The first through electrode 250 of the first semiconductor chip 200 may be electrically connected to the bonding pad 152 of the mounting substrate 100 by a bonding wire 130 through the opening 120 of the substrate 110.

The first chip pad 210 of the first semiconductor chip 200 may be electrically connected to the bonding pad 152 of the mounting substrate 100 by a wire bonding process. Alternatively, the first semiconductor chip 200 may be electrically connected to the mounting substrate 100 by a tap automated bonding (TAB) process.

A first molding member 500 may be formed in the opening 120 of the substrate 110 to cover the first chip pad 210 of the first semiconductor chip 200 and the bonding wire 130. A second molding member 510 may be formed on the mounting substrate 100 to cover the first and second semiconductor chips 200 and 300, to complete a stack package 10.

As mentioned above, a stack package according to example embodiments may include a mounting substrate having an opening and first and second semiconductor chips mounted on the mounting substrate. Chip pads of the first semiconductor chip may be exposed through the opening. The mounting substrate may include a circuit pattern. The circuit pattern may include a bonding pad to be electrically connected to the first and second semiconductor chips, an outer connection pad and a connection wiring to electrically connect the bonding pad and the outer connection pad.

The first and second semiconductor chips may be electrically connected to each other by a through electrode. The through electrode may be arranged in the middle region thereof. The first and second semiconductor chips may be electrically connected to the mounting substrate by a bonding wire through the opening. The connection wiring may not be formed in a peripheral region of the mounting substrate. Because the connection wiring extends from the opening in the middle region to the outer connection pad, the connection wiring may have a relatively small length to decrease a capacitance loading, thus securing high operating speed of the stack package.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood the at the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stack package, comprising:
a substrate having a first face and a second face opposite the first face, and including an opening;
a first semiconductor chip mounted on the first face of the substrate and including a first through electrode provided in the middle region of the first semiconductor chip, wherein the first through electrode is exposed through the opening of the substrate;
a second semiconductor chip stacked on the first semiconductor chip and electrically connected to the first semiconductor chip by the first through electrode of the first semiconductor chip; and
a circuit pattern on the second face of the substrate, the circuit pattern including a bonding pad arranged adjacent to the opening and electrically connected to the first through electrode of the first semiconductor chip through the opening, an outer connection pad spaced apart from the bonding pad and a connection wiring extending from the opening to the outer connection pad via the bonding pad, wherein first surfaces of the first and second semiconductor chips face the first face of the substrate.

2. The stack package of claim 1, wherein the first semiconductor chip comprises a chip pad in the middle region, and the first through electrode penetrates the chip pad.

3. The stack package of claim 2, wherein the first semiconductor chip further comprises a redistribution pad configured to electrically connect to the chip pad.

4. The stack package of claim 3, wherein the redistribution pad is electrically connected to the chip pad by a redistribution wiring.

5. The stack package of claim 1, further comprising:
first and second chip pads on the first surfaces of the corresponding first and second semiconductor chips.

6. The stack package of claim 5, wherein the bonding pad is electrically connected to the first through electrode of the first semiconductor chip by a bonding wire.

7. The stack package of claim 6, further comprising:
a first molding member in the opening of the substrate configured to cover the first chip pads of the first semiconductor chip and the bonding wire; and
a second molding member on the substrate configured to cover the first and second semiconductor chips,
wherein the first and second molding members include epoxy mold compound (EMC).

8. The stack package of claim 5, wherein the second chip pads of the second semiconductor chip are electrically connected to the first through electrode of the first semiconductor chip via a bump.

9. The stack package of claim 1, wherein second surfaces opposite to the first surfaces of the first and second semiconductor chips face the first face of the substrate.

10. The stack package of claim 1, further comprising:
a solder ball on the outer connection pad configured to connect to an external device.

11. The stack package of claim 1, wherein the first semiconductor chip is mounted on the first face of the substrate via a first adhesive film, and the second semiconductor chip is stacked on the first semiconductor chip via a second adhesive film.

12. The stack package of claim 11, wherein the first and second adhesive films include at least one of epoxy and polyimide.

13. The stack package of claim 1, further comprising:
an insulation layer on the second face of the substrate,
wherein the bonding pad and the outer connection pad are exposed through the insulation layer.

14. The stack package of claim 1, wherein the connection wiring further comprises:
a first end portion configured to extend from the bonding pad to the opening; and
a second end portion opposite to the first end portion configured to extend from the bonding pad to the outer connection pad.

15. The stack package of claim 1, further comprising:
a second through electrode configured to penetrate the second semiconductor chip.

* * * * *